United States Patent [19]
Howells et al.

[11] Patent Number: 6,152,680
[45] Date of Patent: Nov. 28, 2000

[54] WAFER CASSETTE ROTATION MECHANISM

[75] Inventors: John Howells, West Linn; Robert H. Niemeyer, III, Tigard, both of Oreg.

[73] Assignee: Daitron, Inc., Wilsonville, Oreg.

[21] Appl. No.: 08/918,332

[22] Filed: Aug. 26, 1997

[51] Int. Cl.[7] .................................................. B65G 49/07
[52] U.S. Cl. ........................ 414/782; 414/781; 414/940
[58] Field of Search .................................. 414/777, 778, 414/779, 781, 782, 936, 940

[56] References Cited

U.S. PATENT DOCUMENTS

| | | | |
|---|---|---|---|
| 3,883,007 | 5/1975 | Hirschboeck | 414/782 |
| 4,674,936 | 6/1987 | Bonora | 414/940 |
| 4,815,912 | 3/1989 | Maney et al. | 414/940 |
| 5,186,594 | 2/1993 | Toshima et al. | 414/782 |
| 5,224,809 | 7/1993 | Maydan et al. | |
| 5,443,348 | 8/1995 | Biche et al. | 414/940 |
| 5,507,614 | 4/1996 | Leonov et al. | |
| 5,525,024 | 6/1996 | Freerks et al. | 414/940 |
| 5,738,483 | 4/1998 | Terpstra | 414/779 |

FOREIGN PATENT DOCUMENTS

| | | | |
|---|---|---|---|
| 1-64335 | 3/1989 | Japan | 414/940 |
| 1459892 | 2/1989 | U.S.S.R. | 414/782 |

*Primary Examiner*—Douglas Hess
*Attorney, Agent, or Firm*—Klarquist Sparkman Campbell Leigh & Whinston, LLP

[57] ABSTRACT

The present invention concerns a device for the rotation of a wafer cassette such as between a horizontal orientation and a vertical orientation. The wafer cassette rotation device includes a carriage for receiving and supporting a wafer cassette, a receptacle in which the carriage is supported and rotates, and a drive mechanism for rotating the carriage together with any wafer cassette that has been inserted into the carriage, between horizontal and vertical orientations. The carriage is shaped to receive a standard wafer cassette, the carriage open at both front and top portions, includes wafer cassette supports. Wheels may be attached to opposing side edges of the bottom of the carriage. A cam drive mechanism is used to move the carriage within the receptacle.

26 Claims, 4 Drawing Sheets

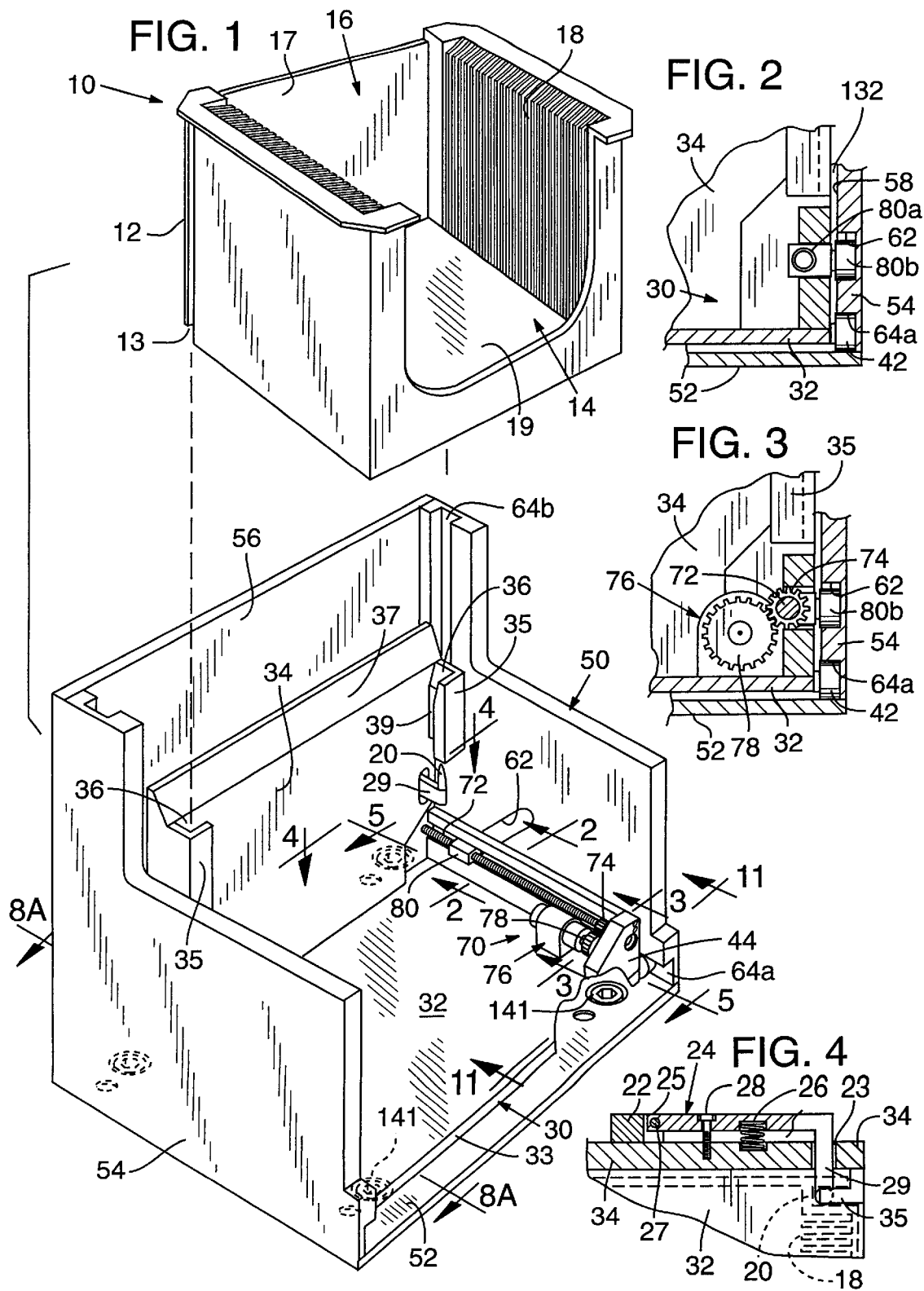

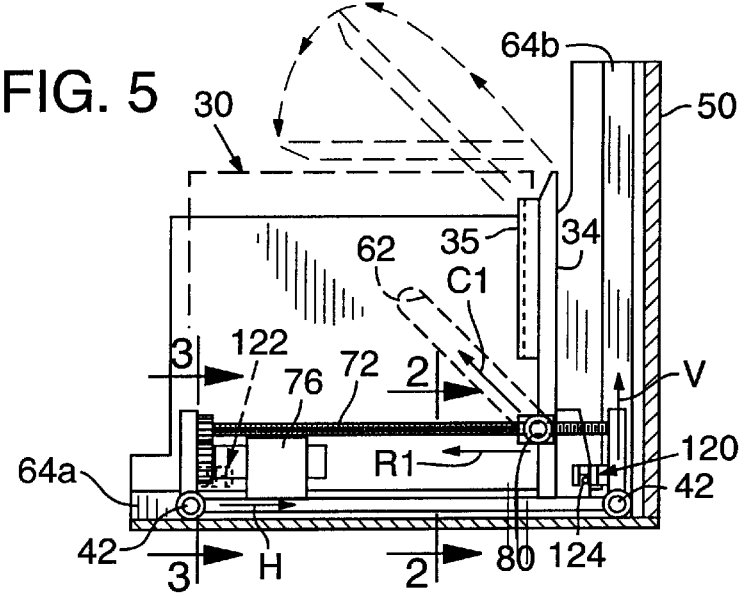
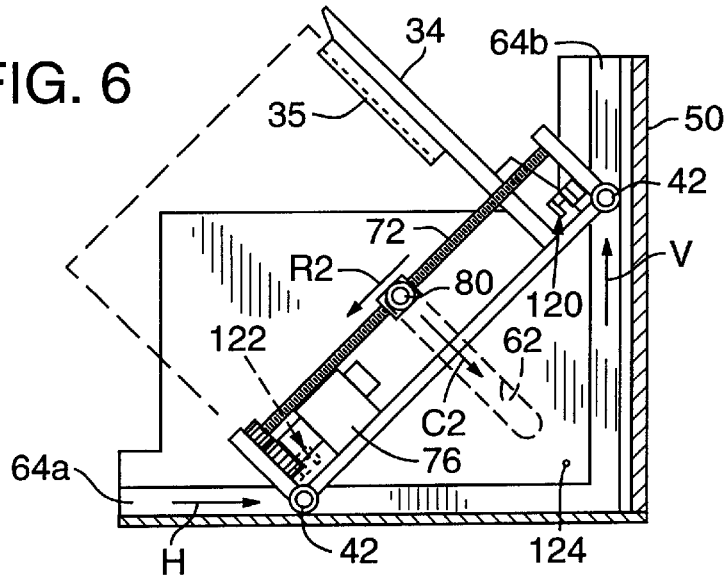
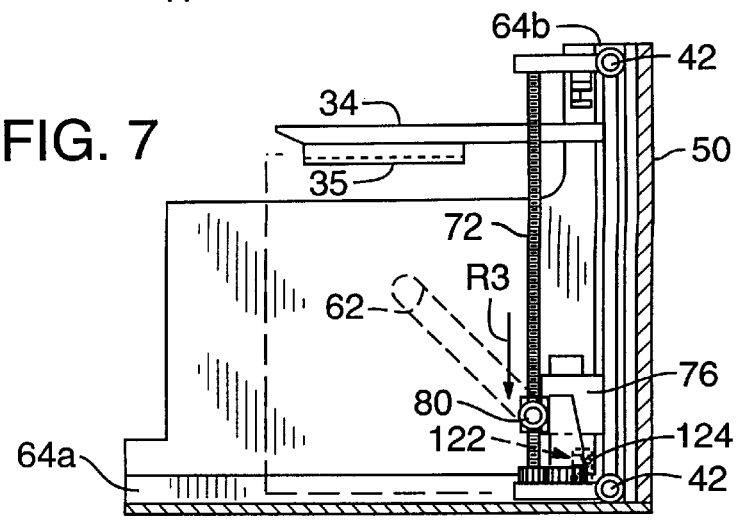

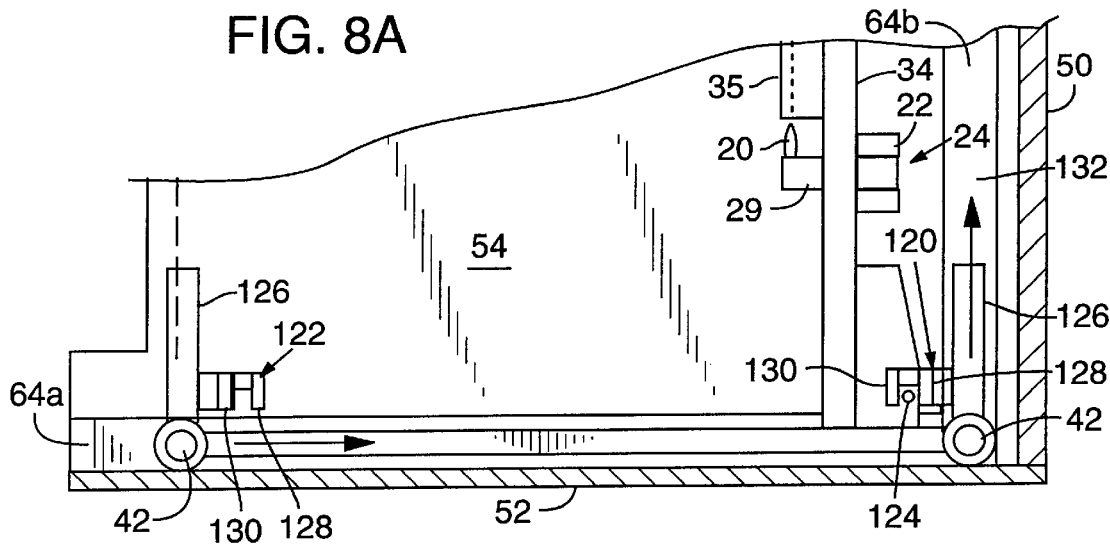
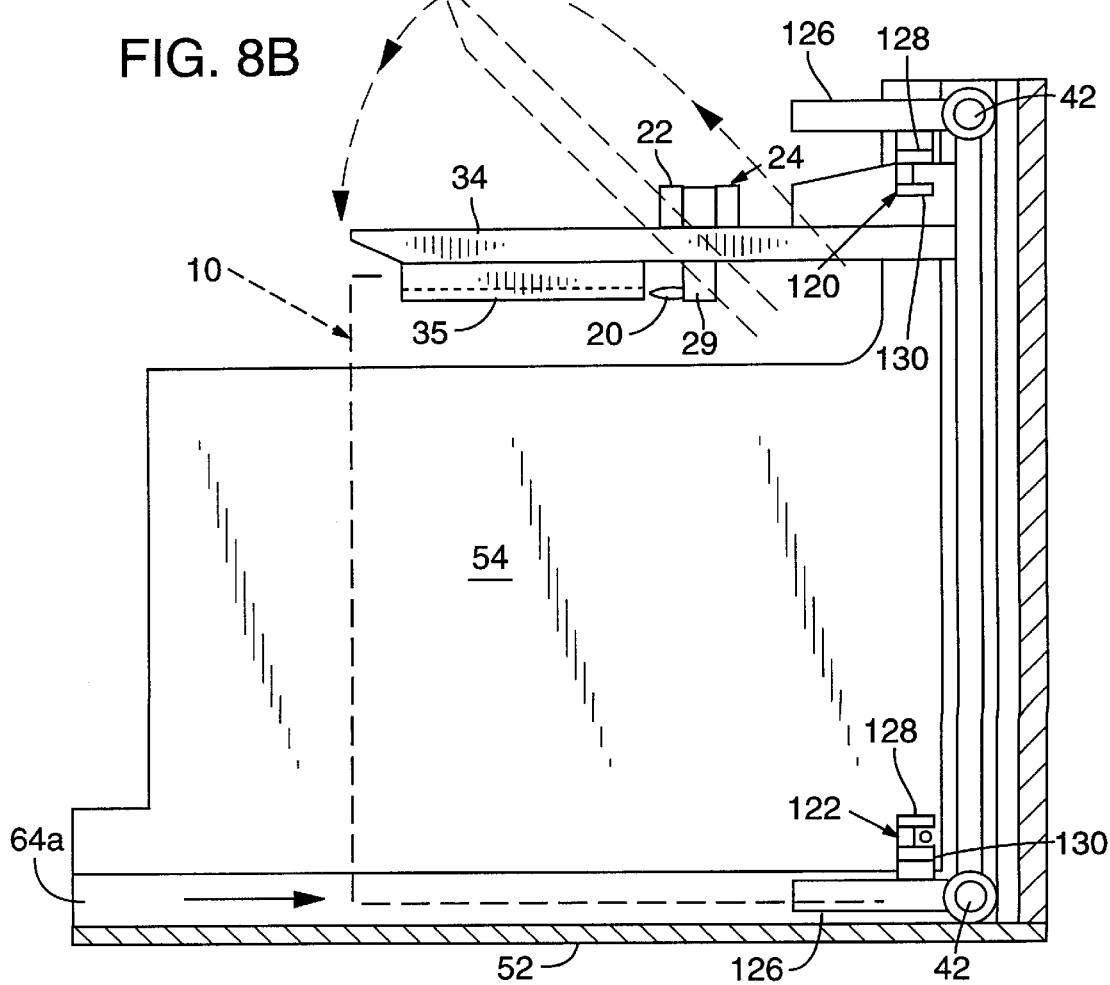

ND COMAN PATENT PLACEHOLDER NOT USED

WAFER CASSETTE ROTATION MECHANISM

FIELD OF THE INVENTION

The present invention relates to a cassette turning mechanism for semiconductor wafers. More specifically, the present invention relates to a mechanism to rotate or pivot semiconductor wafer cassettes between first and second orientations.

BACKGROUND OF THE INVENTION

Integrated circuits and discrete semiconductor devices, such as transistors, are fabricated on substrate wafers. During fabrication and subsequent handling, wafers are loaded in a cassette, which the semiconductor fabrication and handling equipment is adapted to receive. Cassettes typically contain from 1 to 26 wafers and can weigh more than 10 pounds. The wafers are of standard sizes, typically from about six inches to about twelve inches in diameter. The wafers are positioned within the cassette in parallel slots or grooves on opposing sides of a standard cassette and are loaded and unloaded through an opening at the top portion of the cassette. When the wafers are vertically oriented the cassette is said to be vertically oriented; when the wafers are horizontally oriented, the cassette is said to be horizontally oriented.

The cassette typically must be positioned vertically for safe wafer handling by human operators or robotic handling devices between work stations in the semiconductor fabrication process. However, the cassette typically must generally be oriented horizontally for access by work station robotic arms. Thus, the cassette must be rotated or pivoted between the vertical and horizontal positions. The majority of semiconductor equipment requires the human operator to manually rotate the cassette.

Manual rotation of wafer-loaded cassettes has led to long-term disabilities resulting from repetitive stress syndrome. Safety guidelines for Ergonomic/Human Factors Engineering of Semiconductor Manufacturing Equipment, SEMI S8-95, Article 11, require that human operators avoid simultaneously lifting and rotating or manually orienting products and/or containers. Accordingly, there is a need for automated wafer cassette rotation devices.

Previous approaches to automating wafer cassette rotation typically involve devices that are both large and complex. The large size of the prior cassette rotation devices is undesirable as they require more room in clean room areas of limited space. The large size of the devices also limits retrofitting of cassette rotation devices into existing fabrication processes or work stations, as the processing equipment, like most clean rooms, offers only limited available space. Further, the complexity of the prior devices has created loss of productivity due to frequent mechanical failures, increased contamination of wafers, and require extensive downtime for maintenance.

SUMMARY OF THE INVENTION

The present invention concerns a device for the rotation of a wafer cassette between first and second orientations and most preferably between a horizontal orientation and a vertical orientation. A preferred embodiment of the wafer cassette rotation device of the present invention includes a carriage for receiving and supporting a wafer cassette, a receptacle in which the carriage rotates, and a drive mechanism for rotating the carriage and any wafer cassette that has been inserted into the carriage, between first and second orientations. In the illustrated embodiment, these two orientations are orthogonal and are respectively horizontal and vertical.

In a preferred embodiment, the carriage is shaped to receive a standard wafer cassette. The carriage, open at both front and top portions, includes wafer cassette supports. The opposing side edges of a bottom portion of the carriage are coupled to the receptacle for motion relative to the receptacle. Rollers or other couplers may be used to facilitate this relative motion.

The carriage fits within the receptacle. The illustrated receptacle includes a base plate connected to opposing side plates, and a back plate connected therebetween leaving a top portion and front portion of the receptacle open. A cam guide, shaped to receive a cam follower is provided and is preferably defined within an interior surface of a side plate of the receptacle. Wheel guides are preferably defined in both side plates. The wheel guides preferably extend along a first path substantially parallel with the base plate of the receptacle from the back plate to a front end of the base plate and extend along a second path substantially perpendicular to the base plate from the rear of the base plate to a top of each side plate.

A drive mechanism connected to the carriage, moves the carriage, and any wafer cassette inserted therein, in a rotational pattern within the receptacle. The illustrated drive mechanism includes a cylinder or rod extending substantially the length of the carriage from back to front. The rod or cylinder is, preferably, parallel with the bottom of the carriage. A cam follower, adapted to fit within and travel along the cam guide, is attached to the rod or cylinder. The drive mechanism further includes a motor or other means for moving the cam follower along the rod or cylinder and, thus, within the cam guide of the receptacle. Simultaneously, the wheels of the carriage are moved along the wheel guides of the receptacle to rotate the carriage within the receptacle between vertical and horizontal orientations.

The wafer cassette rotation device of the present invention is simple in both construction and operation. The cassette rotation device is compact and requires minimal space for full rotation of the wafer cassette between vertical and horizontal orientations. That is, the wafer cassette rotation device of the present invention possesses rotation pattern dimensions that are only slightly greater in size than the size of a wafer cassette.

The relatively small rotation pattern and the relatively small size of the cassette rotation device itself, requires only minimal space. Additionally, the relatively small size lends itself to retrofitting of the device into various, existing semiconductor work stations. The simple construction and operation of the cassette rotation device decreases the likelihood of loss of production due to mechanical failures, contamination of semiconductor fabrication environments with particulates or other matter introduced from the device, and minimizing necessary maintenance efforts.

BRIEF DESCRIPTION OF THE DRAWINGS

FIG. 1 is a perspective view of an embodiment of the wafer cassette rotation mechanism of the present invention.

FIG. 2 is an enlarged sectional view taken along line 2—2 of FIG. 5.

FIG. 3 is an enlarged sectional view taken along line 3—3 of FIG. 5.

FIG. 4 is an enlarged sectional view taken along line 4—4 of FIG. 1.

FIG. 5 is a sectional view taken along line 5—5 of FIG. 1 showing the carriage in a vertical position.

FIG. 6 is a sectional view taken along line 5—5 of FIG. 1 showing the carriage at about a 45 degree rotation angle.

FIG. 7 is a sectional view taken along line 5—5 of FIG. 1 showing the carriage in a horizontal position.

FIG. 8A is a sectional view taken along line 8A—8A of FIG. 1 showing the carriage in a vertical position.

FIG. 8B is a sectional view taken along line 8A—8A of FIG. 1 showing the carriage in horizontal position.

DETAILED DESCRIPTION OF THE INVENTION

Figure 9:
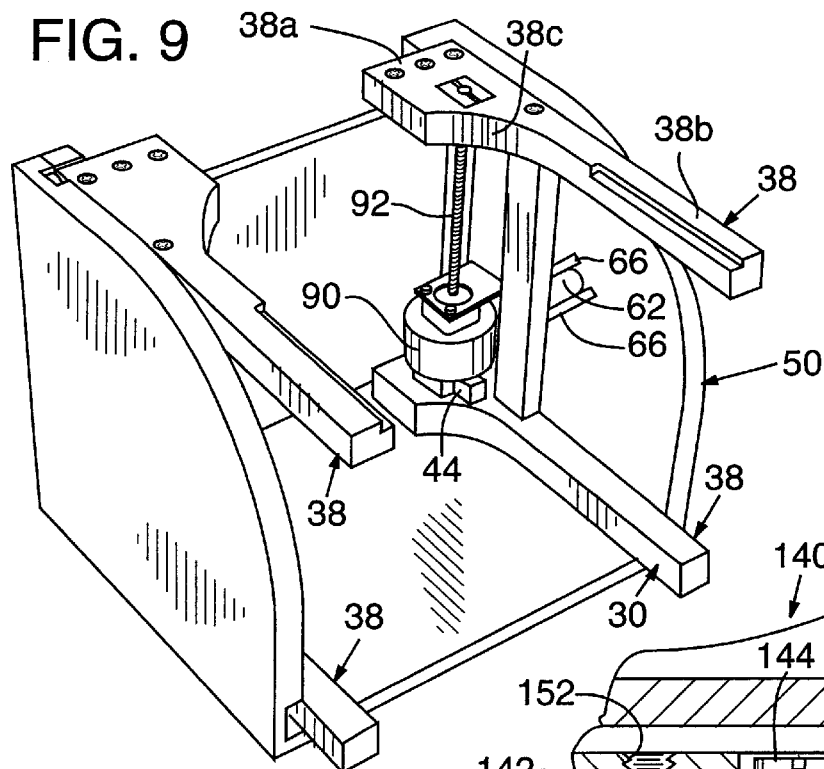
FIG. 9 is a perspective view of an alternative embodiment of the wafer cassette rotation mechanism of the present invention.

Referring to FIG. 1, the illustrated embodiment of the cassette rotation device of the present invention comprises a carriage 30 for receiving and supporting a wafer cassette 10, a receptacle 50 for receiving the carriage 30 and a drive mechanism 70 for driving the carriage 30 within the receptacle 50 to rotate it between first and second orientations such as a vertical orientation (as shown by solid lines in FIG. 5) and a horizontal orientation (as shown by solid lines in FIG. 7). Most preferably, although not necessarily, the orientations are orthogonal to one another.

In general, cassettes are of dimensions and designs standardized by the industry and known to those skilled in the art. A typical wafer cassette 10 is a substantially cubical container having an open front 14 and top 16 (FIG. 1). Inner-facing slots, adapted to receive standard sized semiconductor wafers, extend vertically along opposing sides 18 of the wafer cassette 10. Outwardly-facing exterior protrusions or ears 12 extend vertically along opposing side edges of a back plate 17 of the wafer cassette 10 from the top 16 to near a floor 19 of the cassette to form grooves 13.

In a preferred embodiment of the present invention, the carriage 30 includes a bottom plate 32 of slightly larger dimensions than the floor 19 of the wafer cassette 10. A rear plate 34 of the carriage 30 extends upwardly from a rear edge of the bottom plate 32 in a direction substantially perpendicular thereto. The rear plate 34 is adjustably connected to the bottom plate 32, in a conventional manner, such that the position of the rear plate 34 may be adjusted to be closer to or further from the front edge 33 of the bottom plate 32. The adjustable connection allows the carriage 30, and hence the wafer cassette 10, to be aligned with work station robotic arm motions (not shown).

In a preferred embodiment of the present invention, the rear plate 34 is adjustably attached to the bottom plate 32 via fasteners. The fasteners extend vertically upwardly from the underside of the bottom plate 32, through elongated slots (not shown) defined in the bottom plate 32, and into the rear plate 34. To adjust the rear plate 34, the operator first loosens the fasteners. The operator then moves the rear plate 34 along the bottom plate 32 in the direction of the elongated slots to the desired position. As the operator moves the rear plate 34, the fasteners slide within the elongated slots in the bottom plate 32. When the rear plate 34 is in the desired position, the operator then tightens the fasteners to secure the rear plate 34 to the bottom plate 32.

To aid in insertion of a wafer cassette 10 into the carriage 30, the carriage includes forwardly extending flanges with inwardly directed bends (or reverse bends) 35. Those wafer cassette engaging flanges are attached to the rear plate 34 at opposing side edges thereof. The reverse bends 35 extend along an upper portion of the rear plate 34 to form opposed guide slots 36 adapted to receive the ears 12 of the wafer cassette 10. The upper front surface 37 of the rear plate 34 and the upper interior surfaces 39 (only one being shown in FIG. 1) of the reverse bends 35 are tapered at the top of guide slots 36 to aid in the insertion of the cassette ears 12 into the guides. Other alternative wafer cassette carriage coupling mechanisms may be used.

Referring now to FIG. 4, two U-shaped brackets 22 are attached to the rear plate 34 of the carriage 30 (one being shown in section in FIG. 4). The brackets 22 are spaced apart with each being positioned on a back surface of the rear plate 34 at a point slightly lower than the flanges with the reverse bends 35. L-shaped members 24 (one being shown in FIG. 4) are connected to U-shaped brackets 22. L-shaped members 24 are positioned such that a first end 25 of each L-shaped member is disposed within and pivotally connected by a pivot 27 to an associated U-shaped bracket 22. The L-shaped member has a first portion extending horizontally along the back side of rear plate 34 substantially parallel with the carriage bottom plate 32. The second end 29 of the L-shaped member 24 extends forwardly through an aperture 23 defined in the rear plate 34. A retainer 20 is provided at the distal end of each of the L-shaped members 24. The retainers 20 preferably extend upwardly from the L-shaped members 24, to a point just below each guide 36 formed by reverse bends 35 (FIGS. 1 and 4).

Each retainer 20 is adapted to extend along the ears 12 when a wafer cassette 10 (as shown by dashed lines in FIG. 4) is inserted into the carriage 30. Each ear 12 is disposed between and engaged by a retainer 20 and the rear plate 34. A compression spring 26 is preferably disposed intermediate the first and second ends of the L-shaped members 24 and between the first portions of the L-shaped members 24 and rear plate 34. The spring 26 biases the second end of the L-shaped member in a direction away from the rear plate 34. Thus the retainer 20 is biased toward the rear plate 34, to further secure an inserted wafer cassette 10 to the carriage 30. Tensioning screws 28 (one being shown in FIG. 4) preferably extend through the L-shaped members and into the rear plate 34. The tensioning screws 28 permit adjustment of the distance between the retainer 20 and the rear plate 34. This distance is adjusted so that the ears 12 of the wafer cassette 10 slide easily but securely into the carriage 30, against retainers 20.

The wafer cassette 10 is thus held tightly against the rear plate 34 by the biased retainers 20. The suspended connection between the retainers 20 and the ears 12 precisely positions the wafer cassette 10 within the carriage 30, relative to the rear plate 34. Such precise positioning is desirable as the rear wall 17 of the wafer cassette 10 is used as a datum plane for programming robotic motions at work stations (not shown) in the semiconductor facility.

The retainers 20 may comprise any suitably rigid material that is wear and corrosion resistant. Preferably, the retainers 20 are made of stainless steel with a hardchrome coating. Stainless steel is particularly well suited for retainers 20 because it is hard and resists corrosion even if the chrome coating wears through due to repeated insertion and removal of wafer cassettes.

Again, any suitable alternative mechanism may be used to hold the wafer cassette in place, although the above illustrated approach is advantageous. For example, in an alternative embodiment, the retainers 20, the corresponding L-shaped members 24 and U-shaped brackets 22 are omitted and the wafer cassette 10 is secured by a frictional fit within the guide slots 36.

In an alternative embodiment of the carriage of the present invention illustrated in FIG. 9, the carriage 30 includes four bars or cassette supports 38, connected to opposing corners of the bottom plate 32. Each cassette support 38 extends substantially perpendicularly from bottom plate 32, such that the cassette support and the bottom plate 32 define a chamber for receiving and supporting the wafer cassette 10.

Cassette supports 38 are, preferably, tapered such that a first end 38a proximate the bottom plate 32 is wider than a second end 38b, distal to the bottom plate 32. Inner-facing sides 38c of supports 38 are preferably tapered inwardly in a concave shape between first end 38a and second end 38b. Cassette supports 38 may also include indentations, mechanical stops or other features (not shown) to assist in rapid manual or mechanical placement of a wafer cassette 10 into the carriage 30.

The carriage 30 of the rotation device of the present invention further includes means for permitting the carriage to rotate in the receptacle 50. Preferably, four wheels 42 are connected to side edges of the bottom plate 32 in opposed sets of two wheels per set. The first set of wheels are located at the front of the carriage 30 (FIG. 5) and the second set of wheels is at the rear of the carriage. The axes of the wheels 42 are perpendicular to the side edges of the bottom plate 32 and in the illustrated form are substantially coplanar with the bottom plate 32 of the carriage 30.

The carriage 30 and the receptacle 50 may be made of any rigid material, such as a metal (e.g., aluminum) or a rigid polymer. The materials are, preferably, resistant to wear and corrosion. Preferably, the carriage 30 and the receptacle 50 comprise Delren®, a polymer available from DuPont, as this particular material minimizes shedding of particles that may contaminate the wafers and/or a clean room environment. Aluminum has also been found to be especially advantageous due to its light weight. The aluminum is, preferably, anodized to decrease the possibility and/or extent of corrosion.

The receptacle 50 of the present invention is of dimensions suitable to receive the carriage 30 (FIG. 1). In a preferred embodiment, the receptacle 50 is only slightly larger than the carriage 30. The receptacle 50 includes a bottom panel 52, opposing side panels 54 and a back panel 56. Each side panel 54 is connected at a lower edge to the bottom panel 52 of the receptacle 50. The front and top of the receptacle 50 in the illustrated embodiment remain open to accommodate the rotation pattern (see dashed lines and arrows in FIG. 5). The back panel 56 is preferably substantially rectangular in shape and is connected to each side panel 54 via conventional fasteners or adhesives. The side panels 54 may be substantially rectangular. The specific shape of these panels may be varied. The side panels 54 have inner surfaces 58 that directly oppose the sides of the carriage 30 when fitted within the receptacle 50.

A cam guide 62 is provided, preferably in the receptacle. In the illustrated form, the cam guide 62 is recessed into or otherwise defined on the inner surface 58 of a side panel 54 of the receptacle 50. The illustrated cam guide 62 is generally an elliptically-shaped channel, although the shape is not critical as long as the cam follower 80 described below, fits within the cam guide. The cam guide 62 extends forwardly and upwardly, preferably, at an angle of about 45 degrees measured relative to the plane of the bottom panel 52.

Referring now to FIG. 9, in a preferred embodiment, inserts 66, such as of tungsten carbide or any hardened material, are disposed along opposing sides of the cam guide 62. inserts 66 allow the cam follower 80 (described below) to run smoothly along the cam guide 62. Further, the inserts 66 minimize wear and contamination by decreasing the particulates shedded by the cam guide due to frequent moving of the cam follower 80.

In the embodiment as shown in FIG. 1, the side panels 54 each include wheel guides 64 defined therein. Wheel guides 64 include first wheel guides 64a in the illustrated form extending in a straight line horizontally along the bottom of the inner surfaces 58, substantially parallel with the bottom panel 52. Second wheel guides 64b in the illustrated form extend vertically and in a straight line along the rear portion of the inner surface 58 of the side panels 54, substantially parallel to the back panel 56. The first and second wheel guides 64a, 64b or horizontal and vertical wheel guide paths, respectively, of the wheel guides 64 meet at the bottom rear corner of side panels 54. The wheel guides 64 are shaped and dimensioned for accepting the wheels 42 of the carriage 30 and allowing the wheels to rotate freely therein.

A preferred embodiment of the present invention includes a leveling mechanism 140 (FIG. 11) which may take the form of multiple fasteners arranged to secure and level the device. The fasteners level, support, and secure the receptacle 50 to a work station surface, such as surface 146 shown in FIG. 11. The fasteners are operable to adjust the height of the rotation device and to level the device so that an inserted wafer cassette 10 properly aligns with a work station robotic arm (not shown) when the wafer cassette 10 is oriented in the horizontal or other desired position in the carriage 30. In a preferred embodiment, the securing/leveling fasteners comprise sets of screws positioned at opposing corners of the bottom panel 52 of the receptacle 50 (FIG. 1).

Figure 11:
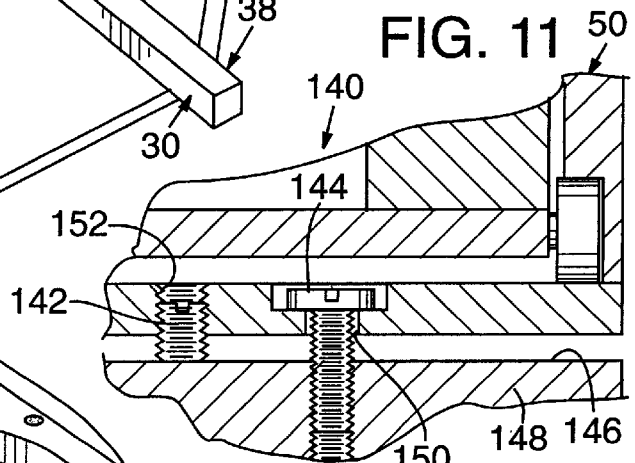
FIG. 11 is a sectional view taken along line 11—11 of FIG. 1.

More specifically, each set of screws includes a tightening screw 141 with a head 144 and a lifting screw 142 (FIG. 11). The lifting screws 142 threadably engage internal threaded apertures 152 defined in bottom panel 52 of receptacle 50. The lifting screws 142 extend to the surface 146 of a support plate 148 of a work station such that the bottom panel 52 of the receptacle 50 rests on the lifting screws 142. The tightening screws 141 extend through apertures 150 defined in the bottom panel 52 of the receptacle 50. The tightening screws 141 engage threaded apertures defined in the support plate 148 such that the receptacle 50 is secured thereto. Each corner of the receptacle 50 may be raised separately by adjusting the lifting screws 142 and loosening the tightening screws 141 or lowered by loosening the tightening screws 141 and adjusting the lifting screws 142, as necessary to level the rotation device.

A drive mechanism 70 is included to drive the carriage 30 (and the wafer cassette 10) between vertical and horizontal orientations. The illustrated drive mechanism 70 is attached to the carriage 30 to drive at least one cam follower 80 from front to rear along the cam guide 62 defined in a side of the carriage 30.

A preferred embodiment of the drive mechanism 70 comprises a motor 76 coupled to a threaded rod 72 (FIG. 1). A cam follower 80 is also threadably coupled to the threaded rod 72. The threaded rod 72 extends along a side edge of the bottom plate 32 of the carriage 30. The threaded rod 72 may, for example, be fastened to the cassette supports 38 of the embodiment illustrated in FIG. 9 or to braces 44, which are fastened to the bottom plate 32 of the carriage 30 of the embodiment illustrated in the FIG. 1.

The threaded rod 72 has external threads extending along the length of the rod. Additionally, a drive gear 74 is mounted to one end of the rod and drivenly coupled to the rod for rotating the rod as gear 74 is driven. A motor 76, such as the electric motor, model no. REO13-039, available from Maxon, Moorepark, Calif., is drivenly connected to a gear 78 which in turn engages rod drive gear 74. Therefor, operation of the motor in one direction drives the rod in a first direction about the longitudinal axis of the rod. Conversely, operation of the motor in the opposite direction causes the rod to rotate in the opposite direction. Cam follower 80 moves along the rod as the rod rotates with the direction of motion of the cam follower depending upon the direction the rod is rotated.

That is, the cam follower 80 has internal threads 80*a* (FIG. 2) adapted to threadably engage the external threads of the threaded rod 72. The cam follower 80 includes a projection 80*b* (FIG. 2) adapted to mate with the cam guide 62 of the receptacle 50. In a preferred embodiment of the present invention, the outer-facing projection 80*b* is a conventional bearing. The motor 76 rotates the threaded rod 72, forcing the cam follower 80 along the threaded rod.

In an alternative embodiment shown in FIG. 9, the drive mechanism includes an electric motor 90, such as an electric micromotor from Maxon Precision Motors of Burlingame, Calif. Electric motor 90 is disposed around a threaded rod 92 and attached to an outwardly-projecting cam follower (not shown). The cam follower is adapted to mate with the cam guide 62. The threaded rod 92 is rotatably fixed to braces 44 attached to the carriage 30. An armature (not shown) of the electric motor 90 has internal threads adapted to engage the threads of the threaded rod 92. As the electric motor 90 powers the armature (not shown), the armature engages the threads on rod 92, such that the motor 90 and thus, the cam follower, move along the threaded rod.

Figure 10:
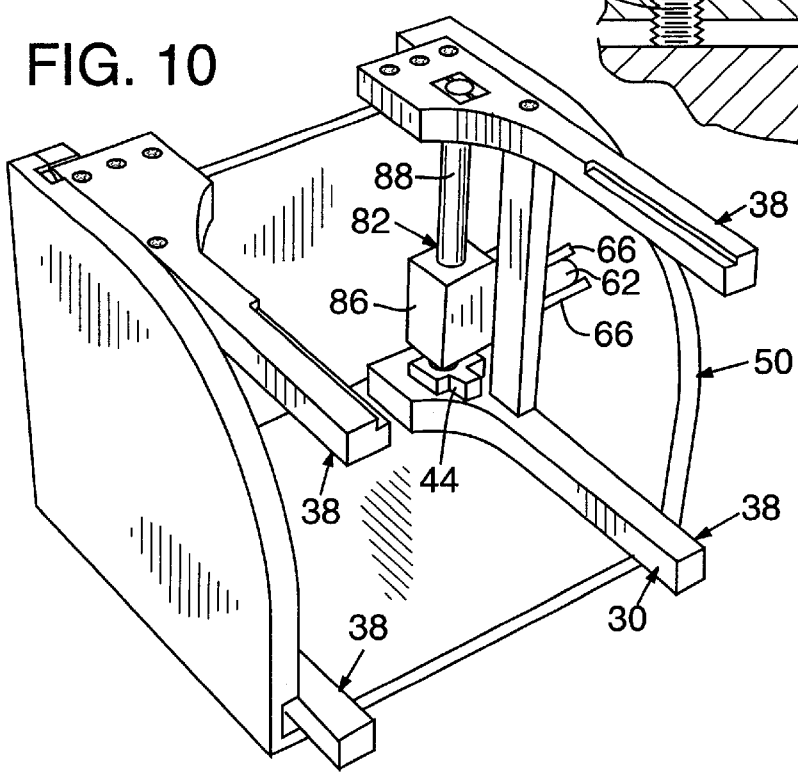
FIG. 10 is a perspective view of another embodiment of the wafer cassette rotation mechanism of the present invention.

In yet another alternative embodiment shown in FIG. 10, the drive mechanism includes two rodless cylinders 82, such as rodless cylinder model no. NCY2B15H-0400 available from S.M.C., of Portland, Oreg. The rodless cylinders 82 are attached to the carriage 30. Each rodless cylinder 82 includes a tube 88, an internal piston (not shown) and an external piston 86 having a cam follower connected thereto (not shown). The internal piston is positioned within the tube 88 and comprises magnetic material. The external piston 86 substantially surrounds approximately one quarter of the length of the tube 88. The external piston 86 comprises a material that is magnetically attracted to the internal piston.

The cam follower 80 is moved along the tube 88 by the rodless cylinder 82. Specifically, a pressure source (not shown) creates a first fluid pressure within the tube 88 on one side of the internal piston. The first fluid pressure is greater than a second fluid pressure within the tube 88 on the other side of the internal piston. Thus, the internal piston is forced in a direction toward the second or lower pressure area in the tube 88. The fluid within the tube and pressurizing source comprise any suitable fluids and pressure sources, as known to those skilled in the art. Preferably, oil and/or a compressed air source are used. The magnetic attraction between the internal piston and the external piston 86 pulls the external piston 86 along the tube 88 with the internal piston. As the external piston 86 moves, the cam follower also moves. As with the previously described embodiments, the cam follower is shaped and sized to move in the cam guide 62 of the receptacle 50.

Other suitable drive mechanisms for moving the cam follower in either direction along the cam guide may also be used.

The illustrated embodiment of the present invention may further include sensors to indicate when the carriage 30 is in its first orientation, when the carriage 30 is in its second orientation, and when a cassette is fully inserted in the carriage 30 of the rotation device. In a preferred embodiment, the sensors are photo-sensors 120, 122 (FIGS. 8A and 8B) having respective legs 128, 130 with a photo beam travelling between legs 128, 130. When the beam between the legs is broken by an obstruction, sensors 120, 122 are operable to emit a signal indicating the obstruction. A photo-beam breaking pin or dowel 124, adapted to fit between the legs 128, 130 of the sensors 120, 122 preferably extends horizontally and inwardly from an inner surface 58 of the side panel 54 of the receptacle 50. The dowel 124 further extends into a gap 132 (FIG. 2) between the carriage 30 and the side panel 54 of the receptacle 50.

The sensors 120, 122 are preferably disposed within the gap 132 (FIG. 2) between the carriage 30 and the side panel 54 of the receptacle 50. The sensors 120, 122 are, preferably, attached to braces 126 (FIG. 8A). Braces 126 respectively extend upwardly at both the front and rear of the carriage 30 (FIG. 8A). The sensors 120, 122 are positioned such that when the carriage 30 is vertically oriented in the illustrated embodiment as shown in FIG. 8A, legs 128, 130 of sensor 120 are pointed downwardly. When in this position, dowel 124 is disposed between legs 128, 130 of the position sensor 120. When the carriage 30 is horizontally oriented the dowel 124 is disposed between the legs 128, 130 of the position sensor 122 (FIG. 8B).

A third sensor (not shown) is preferably included to indicate when the wafer cassette 10 is fully inserted in the carriage 30. The third sensor may comprise any suitable sensor for accomplishing this purpose. For example, the third sensor may be a photo sensor that emits a signal when it is obstructed by a portion of an inserted wafer cassette such as a projecting beam interrupting flange or blade or a portion of the carriage which is shifted to a beam interrupting position upon insertion of the wafer cassette.

The electronic controls (not shown) for the horizontal and vertical sensors 122, 120, for the third sensor (indicating full cassette insertion) and for the drive mechanism 70 may be located in various positions on the cassette rotation device. Preferably, the electronic controls are positioned such that required size of the rotation device is minimized. For example, if the drive mechanism 70 is positioned on one side of the carriage 30, the electronic controls may be placed on the opposing side. Alternatively, the electronic controls may be placed along the back panel 56 of the receptacle 50.

In operation of the wafer cassette rotation mechanism of the present invention, an operator or a robotic arm places a vertically oriented wafer-loaded wafer cassette 10 into the carriage 30. The wafer cassette 10 is inserted such that the ears 12 of the cassette slide into guide slots 36 of the carriage 30. The third sensor indicates when the wafer cassette 10 is fully inserted.

Explanation of the rotation of the cassette is described with reference to the embodiment of FIG. 1. With reference to FIG. 1, the dowel 124 is sensed by sensor 120 to confirm that the wafer cassette is in the first orientation, which may be the vertical position (i.e., the wafers are vertical in the cassette). The motor 76 rotates the threaded rod 72 in a first direction. Rotation of the rod 72 moves the cam follower 80 from the rear 72*a* of the rod toward the front 72*b* of the rod, as shown by arrow R1 (FIG. 5). As the cam follower 80 travels along the rod 72, the cam follower 80 is forced upward along the cam guide 62. The cam follower 80 travels upward in direction indicated by arrow C1 until it reaches the uppermost part of the cam guide 62 (FIG. 6). At this point, as can be seen in FIG. 6, the carriage 30 is rotated to about 45 degrees relative to the base panel 52 of the receptacle 50. The cam movement has caused the rear wheels 42 of the carriage 30 to travel vertically along the wheel guides 64b (direction V in FIG. 5) and the front wheels 42 of the carriage 30 to travel horizontally along the wheel guides 64a (direction H in FIG. 5).

When the carriage 30 is at about the 45 degree angle (FIG. 6), the cam follower 80 continues to travel in the direction of arrow R2 along the threaded rod 72. Simultaneously, the cam follower 80 proceeds to travel back down the cam guide 62 in the direction of arrow C2 (FIG. 6) until the cam follower reaches the bottom of the cam guide 62 and a location near the end of the threaded rod 72. At the same time, the front and rear wheels 42 of the carriage have travelled in wheel guides 64a, 64b in directions H and V (FIG. 6), respectively, to orient the carriage 30 in a horizontal position (FIG. 7). Position sensor 122 senses when the carriage 30 (and hence the wafer cassette 10) is horizontally positioned (with the wafers horizontal) and produces a signal that turns off the motor 76. Wafers in the wafer cassette 10 may then be accessed manually or by robotic arms (not shown).

When the wafers are returned to the wafer cassette 10 following processing, the operation is repeated in reverse, to rotate the carriage 30 (and the wafer cassette 10) from the horizontal orientation (FIG. 7) to the vertical orientation (FIG. 5).

Although the foregoing invention has been described in connection with preferred and alternative embodiments, it will be appreciated by one of ordinary skill that various modifications and variations may be substituted for the device described here without departing from the invention as defined by the appended claims and their equivalents.

What is claimed is:

1. A wafer cassette rotation device comprising:
   a carriage adapted to receive and secure a wafer cassette, the carriage being rotatable between a first orientation and a second orientation;
   a receptacle having a base, first and second sides and a back, the base, sides and back defining a carriage receiving space, the receptacle being adapted to support the carriage within the carriage receiving space and to permit rotation of the carriage from the first orientation to the second orientation, the carriage being positioned within the carriage receiving space when in the first and second orientations;
   a cam mechanism coupled to the carriage and coupled to the receptacle, the cam mechanism being operable to rotate the carriage between the first and second orientations; and
   the cam mechanism comprising a cam guide and cam follower at least one of which is coupled to the carriage and the other of which is coupled to the receptacle, the cam follower being adapted to travel along the cam guide such that the carriage is rotated between the first and second orientations.

2. A wafer cassette rotation device comprising:
   a carriage adapted to receive and secure a wafer cassette, the carriage being rotatable between a first orientation and a second orientation;
   a receptacle having a base, first and second sides and a back, the base, sides and back defining a carriage receiving space, the receptacle being adapted to support the carriage within the carriage receiving space and to permit rotation of the carriage from the first orientation to the second orientation, the carriage being positioned within the carriage receiving space when in the first and second orientations;
   a cam mechanism coupled to the carriage and coupled to the receptacle, the cam mechanism being operable to rotate the carriage between the first and second orientations; and
   wherein the cam mechanism comprises a cam guide at a side of the receptacle, the cam guide extending at an incline in an upward and forward direction relative to the back, and a cam follower coupled to the carriage and adapted to move along the cam guide such that the carriage is rotated between the first and second orientations.

3. The device of claim 2 wherein the cam guide further includes a wear resistant runner disposed along a side of the cam guide.

4. A wafer cassette rotation device comprising:
   a carriage adapted to receive and secure a wafer cassette, the carriage being rotatable between a first orientation and a second orientation;
   a receptacle having a base, first and second sides and a back, the base, sides and back defining a carriage receiving space, the receptacle being adapted to support the carriage within the carriage receiving space and to permit rotation of the carriage from the first orientation to the second orientation, the carriage being positioned within the carriage receiving space when in the first and second orientations;
   a cam mechanism coupled to the carriage and coupled to the receptacle, the cam mechanism being operable to rotate the carriage between the first and second orientations;
   wherein the receptacle further includes a first path defined in the first and second sides of the receptacle, a second path defined in the first and second sides of the receptacle at an angle substantially perpendicular to the first path, and first and second carriage movers engaging and following the respective first and second paths as the carriage is rotated.

5. The device of claim 4 in which:
   the first carriage mover comprises a first set of wheels connected to the carriage, adapted to travel along the first path defined as a channel in the receptacle; and
   the second carriage mover comprises a second set of wheels connected to the carriage, adapted to travel along the second path defined as a channel in the receptacle.

6. The device of claim 5 further including a drive mechanism operable to move the cam follower along the cam guide such that the carriage is rotated between the first and second orientations.

7. The device of claim 6 wherein the drive mechanism is operable to move the first set of wheels along the first path and the second set of wheels along the second path as the cam follower is moved along the cam guide.

8. A wafer cassette rotation device comprising:
   a carriage adapted to receive and secure a wafer cassette, the carriage being rotatable between a first orientation and a second orientation;
   a receptacle having a base, first and second sides and a back, the receptacle being adapted to support the carriage and permit rotation of the carriage therein;

a cam mechanism coupled to the carriage and coupled to the receptacle, the cam mechanism being operable to rotate the carriage between the first and second orientations; and wherein the carriage further includes a bottom plate connected to a rear plate, the rear plate having reverse bends attached to opposing side edges thereof, the reverse bends shaped to form guides adapted to receive a portion of a wafer cassette.

9. The device of claim 8 wherein the carriage further includes an upwardly extending retainer positioned substantially directly below one of the reverse bends, the retainer being adapted to receive and secure a wafer cassette.

10. The device of claim 9 wherein the retainer is biased in a direction toward the rear plate of the carriage.

11. The device of claim 8 wherein an uppermost portion of the rear plate and an upper most portion of the guides are tapered.

12. A wafer cassette rotation device comprising:

a carriage adapted to receive and secure a wafer cassette, the carriage being rotatable between a first orientation and a second orientation;

a receptacle having a base, first and second sides and a back, the receptacle being adapted to support the carriage and permit rotation of the carriage therein;

a cam mechanism attached to the carriage and coupled to the receptacle, the cam mechanism being operable to rotate the carriage between the first and second orientations; wherein the cam mechanism comprises:
  a cam guide at a side of the receptacle, the cam guide extending at an incline in an upward and forward direction relative to the back; and
  a cam follower connected to the carriage and adapted to move along the cam guide such that the carriage is rotated between the first and second orientations; and
the device further including a securing and leveling assembly comprising:
  first and second, adjacent threaded apertures defined in the base of the receptacle;
  a support surface underlying the base, the support surface having a threaded aperture defined therein;
  a tightening screw adapted to engage and extend through the first threaded aperture and engage the threaded aperture defined in the support surface;
  a lifting screw adapted to engage and extend through the second threaded aperture and rest upon the support surface;
  wherein the receptacle may be raised or lowered, relative to a plane defined by the support surface, by adjusting the lifting screw; and
  wherein the receptacle may be secured to the support surface by tightening the tightening screw.

13. A wafer cassette rotation device comprising:

a carriage adapted to receive a wafer cassette;

a receptacle having a bottom connected to first and second sides and a back, the receptacle being adapted to support the carriage and permit rotation of the carriage from a first orientation to a second orientation;

a first path in the form of a channel defined in the first and second sides of the receptacle and a second path in the form of a channel defined in the first and second sides of the receptacle, the second path being defined at an angle substantially perpendicular to the first path;

a first set of wheels connected to the carriage and adapted to travel along the first path defined in the receptacle, a second set of wheels connected to the carriage and adapted to travel along the second path defined in the receptacle such that when the first and second sets of wheels of the carriage travel along their respective paths defined in the receptacle, the carriage rotates between a first orientation wherein the wafer cassette is vertically oriented and a second orientation wherein the wafer cassette is horizontally oriented.

14. The device of claim 13 wherein the carriage further includes a bottom plate connected to a rear plate, the rear plate having reverse bends shaped to form guides adapted to receive a portion of a wafer cassette.

15. A wafer cassette rotation device comprising:

a carriage adapted to receive a wafer cassette;

a receptacle having a bottom connected to first and second sides and a back, the receptacle being adapted to support the carriage and permit rotation of the carriage therein;

a first path defined at the first and second sides of the receptacle and a second path defined at the first and second sides of the receptacle, the second path being defined at an angle to the first path;

a first set of wheels connected to the carriage and adapted to travel along the first path defined in the receptacle, a second set of wheels connected to the carriage and adapted to travel along the second path defined in the receptacle such that when the first and second sets of wheels of the carriage travel along their respective paths defined in the receptacle, the carriage rotates between a first orientation wherein the wafer cassette is vertically oriented and a second orientation wherein the wafer cassette is horizontally oriented; and the device further including a drive mechanism coupled to the carriage to drive the first and second sets of wheels of the carriage along their respective paths in the receptacle.

16. The device of claim 15 wherein the drive mechanism comprises:

a cam guide recessed into the first side of the receptacle, the cam guide extending at an upward incline in a forward direction relative to the back panel;

a cam follower connected to the carriage and adapted to move along the cam guide such that the carriage is rotated between the first and second orientations; and wherein the drive mechanism comprises a motor operable to drive the cam follower to move along the cam guide.

17. A wafer cassette rotation device comprising:

a carriage adapted to receive a wafer cassette;

a receptacle having a bottom connected to first and second sides and a back, the receptacle being adapted to support the carriage and permit rotation of the carriage therein;

a first path defined at the first and second sides of the receptacle and a second path defined at the first and second sides of the receptacle, the second path being defined at an angle to the first path;

a first set of wheels connected to the carriage and adapted to travel along the first path defined in the receptacle, a second set of wheels connected to the carriage and adapted to travel along the second path defined in the receptacle such that when the first and second sets of wheels of the carriage travel along their respective paths defined in the receptacle, the carriage rotates between a first orientation wherein the wafer cassette is vertically oriented and a second orientation wherein the wafer cassette is horizontally oriented;

a drive mechanism coupled to the carriage to drive the first and second sets of wheels of the carriage along their respective paths in the receptacle; and wherein the drive mechanism further includes:
a rod having external threads extending the length of the rod, the rod rotatably connected to the carriage;
a cam follower coupled to the rod; and
wherein the cam follower includes internal threads adapted to threadably engage the external threads of the rod such that as the rod is rotated, the cam follower moves along the threaded rod.

18. The device of claim 17 wherein the drive mechanism includes a cam guide and wherein the cam follower further includes an outwardly facina projection adapted to fit within and move along the cam guide as the rod is rotated.

19. A wafer cassette rotation device comprising:
a carriage adapted to receive and secure a wafer cassette, the carriage rotatable between a first orientation and a second orientation;
a receptacle having a bottom panel connected to first and second side panels and a back panel, the receptacle adapted to support the carriage and permit rotation of the carriage therein;
a cam guide included in the receptacle, the cam guide extending at an upward incline in a forward direction relative to the back panel;
a cam follower connected to the carriage and adapted to move along the cam guide;
a first path defined in the first and second sides of the receptacle and a second path defined in the first and second sides of the receptacle at an angle substantially perpendicular to the first path;
a first set of wheels connected to the carriage, adapted to travel along the first path defined in the receptacle and a second set of wheels connected to the carriage, adapted to travel along the second path defined in the receptacle; and
a drive mechanism operable to move the cam follower along the cam guide such that the carriage is rotated between the first and second orientations.

20. A wafer cassette rotation device comprising:
a support including an upright guide and a base;
a wafer cassette receiving carriage having first and second opposed sides, a first side coupler adapted to movably couple the first side to the base and a second coupler adapted to movably couple the second side of the carriage to the upright guide for movement in a first direction defined by the upright guide;
a carriage drive operably coupled to the carriage to move the second side in the first direction with the upright guide confining the movement of the second side of the carriage in the direction defined by the upright guide; and whereby the first side of the carriage moves along the base in a second direction and toward the upright support as the second side of the carriage moves upwardly along the upright guide to thereby rotate a wafer cassette received by the carriage.

21. A wafer cassette rotation device according to claim 20 in which the first and second directions are along straight lines which are orthogonal to one another.

22. A wafer cassette rotation device according to claim 21 in which the first and second directions are respectively vertical and horizontal.

23. A wafer cassette rotation device according to claim 20 in which the first and second couplers comprise respective sets of wheels and the upright guide comprises a guide track which guides the sets of wheels at the second side of the carriage.

24. A method of rotating a wafer cassette comprising:
providing a carriage having a base with first and second opposed side edge portions;
detachably mounting a cassette to the carriage;
moving the first side edge portion of the base upwardly in a first upright plane; and
simultaneously moving the second side edge portion of the base in a second plane intersecting the first upright plane and in a direction toward the first plane to thereby tilt the carriage and mounted cassette.

25. A method of rotating a wafer cassette comprising:
providing a carriage having first and second opposed side edges;
detachably mounting a cassette to the carriage;
moving the first side edge of the carriage upwardly in a first upright plane; and
simultaneously moving the second side edge of the carriage in a second plane intersecting the first upright plane in a direction toward the first plane to thereby tilt the carriage and mounted cassette including the step of continuing the motion of the first and second side edges until both the first and second side edges are in the first upright plane.

26. A method of rotating a wafer cassette comprising the steps of:
positioning a wafer cassette in a wafer cassette carriage, the carriage having first and second opposed side edges;
moving the second side edge of a cassette carriage upwardly in a first direction along a guide;
simultaneously moving the first side edge of the cassette carriage in a second direction along a base and toward the guide to position the second side edge above the first side edge to thereby tilt the wafer cassette.

* * * * *

UNITED STATES PATENT AND TRADEMARK OFFICE
CERTIFICATE OF CORRECTION

PATENT NO.   : 6,152,680
DATED        : November 28, 2000
INVENTOR(S)  : Howells et al.

Page 1 of 1

It is certified that error appears in the above-identified patent and that said Letters Patent is hereby corrected as shown below:

Column 6,
Line 6, change "inserts" to -- Inserts --

Column 13,
Line 14, change "facina" to -- facing --

Signed and Sealed this

Twenty-first Day of May, 2002

Attest:

JAMES E. ROGAN
*Attesting Officer*   *Director of the United States Patent and Trademark Office*